(12) United States Patent
Ray

(10) Patent No.: US 7,750,735 B1
(45) Date of Patent: Jul. 6, 2010

(54) VOLTAGE-LEVEL TRANSLATOR

(75) Inventor: Abhijit Ray, Sunnyvale, CA (US)

(73) Assignee: SuVolta, Inc., Los Gatos, CA (US)

( * ) Notice: Subject to any disclaimer, the term of this patent is extended or adjusted under 35 U.S.C. 154(b) by 49 days.

(21) Appl. No.: 12/171,906

(22) Filed: Jul. 11, 2008

(51) Int. Cl.
*H03F 3/45* (2006.01)

(52) U.S. Cl. .................................................. 330/253

(58) Field of Classification Search ............... 330/253, 330/255, 257, 262, 269, 264; 327/333
See application file for complete search history.

(56) References Cited

U.S. PATENT DOCUMENTS

| 5,999,054 A | * | 12/1999 | Suzuki | 330/255 |
| 2008/0308816 A1 | | 12/2008 | Miller et al. | 257/76 |

* cited by examiner

*Primary Examiner*—Robert Pascal
*Assistant Examiner*—Khiem D Nguyen
(74) *Attorney, Agent, or Firm*—Baker Botts L.L.P.

(57) ABSTRACT

A voltage-level translator includes an input node, a differential amplifier, first and second output transistors, and a constant current source. The input node receives an input signal. The differential amplifier produces a voltage swing at an amplifier node based at least in part on a difference between the input signal and a voltage supply. The first output transistor provides a substantially constant current to the output node. The voltage swing produced by the differential amplifier prevents forward biasing of the second output transistor. The constant current source provides a substantially constant current both to the differential amplifier and through the first output transistor. The translator outputs a first voltage in an output voltage range at the output node when the input signal is at a high voltage, and outputs a second voltage in the output voltage range at the output node when the input signal is at a low voltage.

7 Claims, 4 Drawing Sheets

US 7,750,735 B1

VOLTAGE-LEVEL TRANSLATOR

TECHNICAL FIELD

This disclosure relates in general to electronic circuits and, more particularly, to a system and method for voltage level translation.

OVERVIEW

As a result of the rapid technological growth of the past several decades, transistors and other semiconductor devices have become a fundamental building block for a wide range of electronic components. Metal-oxide silicon field-effect transistors (MOSFETs) have been the primary choice for transistors in many applications including general-use microprocessors, digital signal processors, application specific integrated circuits (ASICs), and various other forms of electronic devices. With a growing demand for electronic devices that are increasingly smaller and faster, the inclusion of the metal oxide layer from which MOSFETs derive their name creates significant limitations to further improvements in the size and operating speed of such devices. The use of alternative semiconductor devices, such as junction field-effect transistors (JFETs), may create other problems however, especially if these semiconductor devices must ultimately interface with MOSFET components.

SUMMARY OF EXAMPLE EMBODIMENTS

In accordance with one embodiment of the present disclosure, a voltage-level translator includes an input node, a differential amplifier, a first output transistor, a second output transistor, a current source, and an output node. The input node receives an input signal associated with an input voltage range. The differential amplifier produces a first voltage swing at a first amplifier node based, at least in part, on a difference between the input signal and a voltage supply and produces a second voltage swing at a second amplifier node based, at least in part, on a difference between the input signal and the voltage supply. The second voltage swing is less than the first voltage swing. The first output transistor includes a drain terminal coupled to the output node and a source terminal coupled to the voltage supply and is capable of providing a substantially constant current to the output node through the drain terminal of the first output transistor. The second output transistor includes a drain terminal coupled to the output node, a source terminal coupled to a ground node, and a gate terminal coupled to the second amplifier node. The second voltage swing produced by the differential amplifier is less than a cut-in voltage of the second output transistor. The current source provides a substantially constant current to the output node through the first output transistor. The voltage-level translator outputs an output signal at the output node having a voltage swing that is greater than a cut-in voltage of the first output transistor.

In accordance with another embodiment of the present disclosure, a method for generating an output signal includes receiving an input signal as an input to a differential amplifier. The input signal has a voltage level within an input voltage range. The method further includes generating a constant current using a constant current source and providing at least a portion of the constant current to an output node through a drain terminal of a first output transistor. The method further includes receiving an output of the differential amplifier at a gate terminal of a second output transistor. The output of the differential amplifier has a voltage swing that is less than a cut-in voltage of the second output transistor. Additionally, the method includes drawing current from the output node through the second output transistor in response to the differential amplifier receiving an input signal having a particular voltage level within the input voltage range. The method further includes outputting an output signal at the output node having a voltage swing that is greater than a cut-in voltage of the first output transistor.

Technical advantages of certain embodiments of the present invention include the ability to scale down an input voltage swing to a lower swing suitable for further operation. Moreover, particular embodiments may operate at higher speeds and/or use less power than conventional circuits. Particular embodiments of the disclosure may exhibit none, some, or all of the following advantages depending on the implementation. Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION

Figure 1:
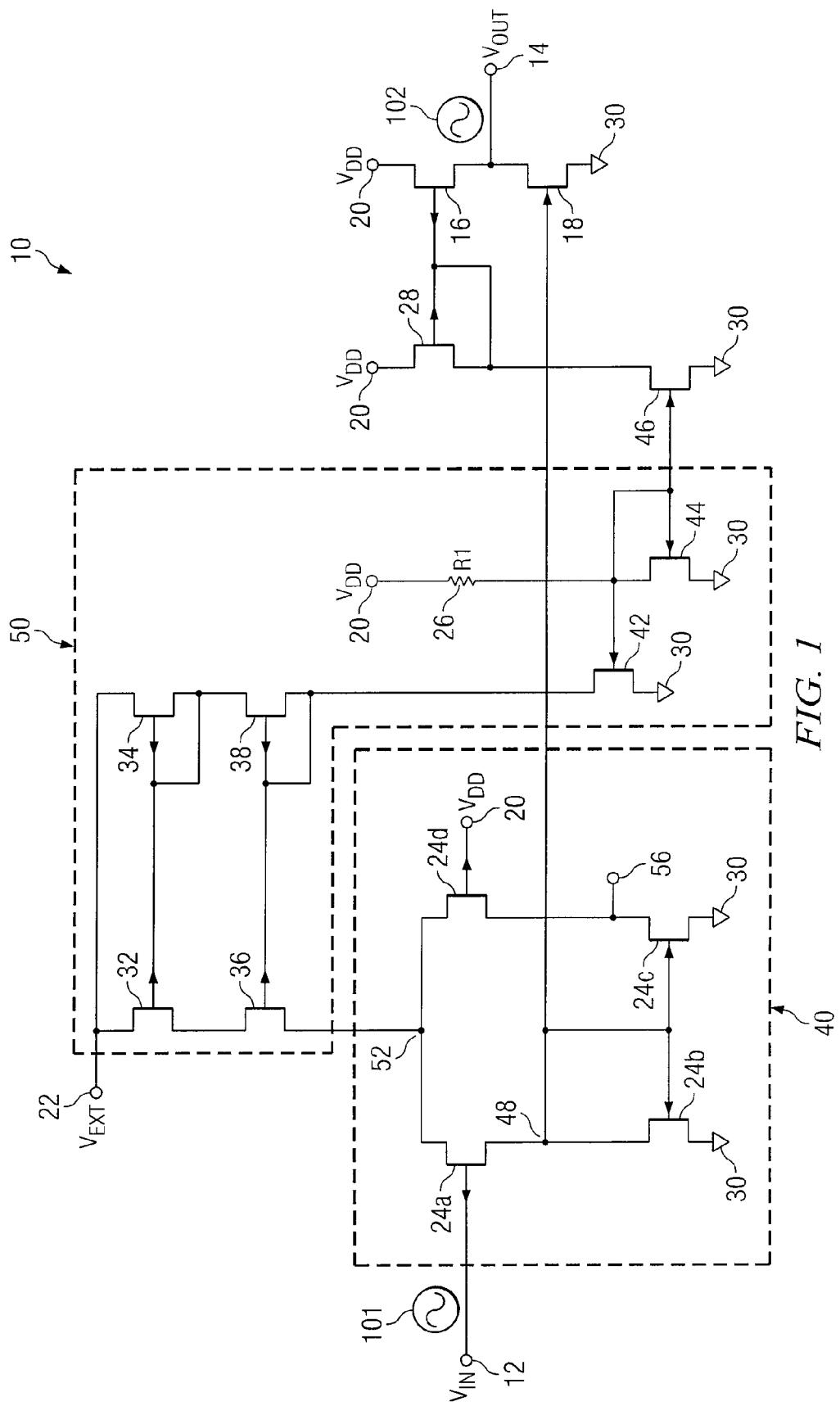
FIG. 1 illustrates one example embodiment of a voltage-level translator.

FIG. 1 illustrates an example embodiment of a voltage-level translator 10 capable of receiving an input signal 101 within a first range (referred to here as the "input voltage range") and outputting an output signal 102 within a second range that differs from the first range. As shown in FIG. 1, the illustrated embodiment of voltage-level translator 10 comprises first output transistor 16, second output transistor 18, a differential amplifier 40, and a constant current source 50. Output transistors 16 and 18 generate an output signal 102 based at least in part on the voltage level of input signal 101. In certain embodiments, low-power junction field-effect transistors ("JFETs") may be used to create a voltage-level translator 10 capable of operating with lower power requirements and/or at faster operating speeds than conventional circuits. However, circuit designs may have to be adjusted to account for one or more special characteristics of low-power JFETs.

Differential amplifier 40 provides a current to second output amplifier 18, based at least in part on the difference between the voltage of input signal 101 and a reference voltage 20. Differential amplifier 40 comprises any appropriate component, element, and/or combination of components or elements suitable to receive an input signal 101 within a first voltage range and a reference voltage 20 at a second voltage (here, $V_{DD}$), and produce one or more output signals based at least in part on the difference between voltage of the input signal 101 and voltage of the reference voltage 20. For example, in the illustrated embodiment, differential amplifier 40 comprises four JFETs coupled as shown in FIG. 1.

More specifically, the illustrated embodiment of differential amplifier 40 includes a first amplifier transistor 24a, a second amplifier transistor 24b, a third amplifier transistor 24c, and a fourth amplifier transistor 24d. First amplifier transistor 24a has a source terminal coupled to constant current source 50, a gate terminal coupled to input node 12, and a drain terminal coupled to a drain terminal of a second amplifier transistor 24b. Second amplifier transistor 24b has a source terminal coupled to ground node 30, a gate terminal coupled to a gate terminal of the third amplifier transistor 24c, and a drain terminal coupled to the drain terminal of first amplifier transistor 24a. Third amplifier transistor 24c has a gate terminal coupled to the gate terminal of second amplifier transistor 24b, a source terminal coupled to ground node 30, and a drain terminal coupled to a drain terminal of fourth amplifier transistor 24d. Fourth amplifier transistor 24d has a drain terminal coupled to a drain terminal of third amplifier transistor 24c, a source terminal coupled to constant current source 50, and a gate terminal coupled to reference voltage 20. First amplifier transistor 24a and fourth amplifier transistor 24d are of a first conductivity type, while second amplifier transistor 24b and third amplifier transistor 24c are of a second conductivity type. Although, in the illustrated embodiment of voltage-level translator 10, second amplifier transistor 24b and third amplifier transistor 24c are coupled to a ground node 30, in alternative embodiments second amplifier transistor 24b and third amplifier transistor 24c may be coupled to a node having any appropriate voltage.

Differential amplifier 40 further comprises one or more output nodes that can output one or more amplifier output signals based at least in part on the difference between a voltage of the input signal 101 and the reference voltage 20. Two such output nodes are shown in FIG. 1 as amplifier output node 48 and amplifier output node 56. In voltage-level translator 10, amplifier output node 48 may be used to provide one or more signals to the gate of second output transistor 18. Amplifier output node 48 provides a smaller voltage swing than amplifier output node 56. In particular embodiments, the voltage swing of amplifier output node 48 is limited between 0 and the threshold voltage of second amplifier transistor 24b (in certain embodiments, Vtn). Because of this smaller voltage swing, using output node 48 to provide one or more signals to the gate of second output transistor 18 prevents forward biasing of second output transistor 18.

In differential amplifier 40, first amplifier transistor 24a and fourth amplifier transistor 24d receive the one or more input signals (in this case, input signal 101 and reference voltage 20) and operate to alter the characteristics of differential amplifier 40 in response to a difference between the voltage level of input signal 101 and the reference voltage 20. The differential pair of first amplifier transistor 24a and fourth amplifier 24d is actively loaded with second amplifier transistor 24b and third amplifier transistor 24c, which collectively act as a current mirror to provide current to second output transistor 18. The operation of differential amplifier will be further discussed below in reference to FIGS. 2A and 2B.

Constant current source 50 can provide amplifier transistors 24a and 24d with bias current at node 52. Constant current source 50 may also provide first output transistor 16 with a constant current through the operation of transistors 46 and 28. Although FIG. 1 illustrates a particular embodiment of constant current source 50 that includes a certain collection of components configured in a particular manner, in alternative embodiments, constant current source 50 may comprise any appropriate component, element, and/or combination of components or elements suitable to generate a substantially constant current for use in voltage-level translator 10.

In the illustrated embodiment, constant current source 50 includes a resistor 26 and a transistor 44. Resistor 26 is coupled to reference voltage 20 (a second supply voltage $V_{DD}$) and to a drain terminal of transistor 44. As a result, a substantially constant current generated by constant current source 50 travels through resistor 26 and into a drain terminal of transistor 44 when transistor 44 is turned on. This current is mirrored in transistors 46 and 28 of voltage-level translator 10, which creates a substantially constant current through first output transistor 16.

In this particular embodiment, constant current source 50 further comprises a number of additional transistors: transistors 32, 34, 36, 38, and 42. As shown in FIG. 1, a source terminal of transistor 44, in the illustrated embodiment, is coupled to a ground node 30. The gate terminal of transistor 44 is further coupled to the drain terminal of transistor 44, and also to the gate terminal of transistor 42. A source terminal of transistor 42 is coupled to ground node 30, and a drain terminal of transistor 42 is coupled to a drain terminal of transistor 38. The drain terminal of transistor 38 is also coupled to a gate terminal of transistor 38, which is further coupled to a gate terminal of transistor 36. A source terminal of transistor 38 is coupled to a drain terminal of transistor 34, which is further coupled to the gate terminal of transistor 34. Additionally, the gate terminal of transistor 34 is coupled to a gate terminal of transistor 32. The source terminal of transistor 34 and the source terminal of transistor 32 are coupled to external voltage node 22. In certain embodiments, external voltage node 22 provides a voltage level of approximately 2.5 V.

As noted above, in particular embodiments constant current source 50 also provides a substantially constant current to differential amplifier 40. More specifically, transistors 32, 34, 36, and 38 may produce a constant current that flows through transistors 32 and 36 and into node 52 of differential amplifier 40. As a result, in the illustrated embodiment, a drain terminal of transistor 36 is coupled to a node 52 of differential amplifier 40 (further described below). The operation of constant current source 50 will be described further below with respect to FIGS. 2A and 2B.

Voltage-level translator 10 also includes output transistors 16 and 18. In certain embodiments, output transistors 16 and 18 comprise JFETs. In the illustrated embodiment, first output transistor 16 comprises a transistor of a first conductivity type and second output transistor 18 comprises a transistor of a second conductivity type. Moreover, in the illustrated embodiment, a source terminal of first output transistor 16 is connected to a reference voltage 20 or to a positive power supply voltage, a gate terminal is connected to a gate terminal of transistor 28, and a drain terminal is connected to an output node 14. A source terminal of second output transistor 18 is connected to ground node 30, a drain terminal is connected to output node 14, and a gate terminal is connected to amplifier output node 48. As a result, first output transistor 16 provides at least a portion of the substantially constant current generated by constant current source 50 to output node 14, while second output transistor 18 selectively provides a path to ground for this current, based on the output of differential amplifier 40.

In operation, voltage-level translator 10 receives an input signal 101 having a voltage within an input voltage range and outputs an output signal 102 having a voltage within an output voltage range. A constant current created by constant current source 50 flows to node 52 of differential amplifier 40. This current splits at node 52 into two different currents (one on each side of differential amplifier 40), whose magnitudes are determined at least in part by the voltage level of input signal 101. The voltage at amplifier output node 48 is applied to the gate of second output transistor 18, which in turn controls the amount of current that travels through second output transistor 18. Since first output transistor 16 has a substantially constant current, current must either flow to output node 14 or be drawn from output node 14 to balance the currents through the output transistors. Sending current to output node or drawing current from output node 14 causes the voltage level of output node 14 to move to either $V_{DD}$ or 0, determined by the voltage at the gate of second output transistor 18. In particular embodiments, the output voltage range may include a smaller range of voltages and/or have a lower maximum voltage than the input voltage range. This may allow output signal 102 to be used as an input by subsequent devices or stages that are configured for smaller input voltage swings and/or smaller maximum input voltages. For example, in the illustrated embodiment, voltage-translator 10 may be used to reduce input signal 101 from input voltage range of 0 V to $V_{ExT}$ to an output voltage range of 0 V to $V_{DD}$, where $V_{ExT}$ is greater than $V_{DD}$.

As one example, an input voltage range may be between 0 and 2.5 V. If an output voltage range between 0 and 0.5 V is desired, voltage-level translator 10 can be designed to receive the input voltage signal 101 at input node 12 and produce an output signal 102 with an output voltage range of 0 and 0.5 V at output node 14. When the voltage level of the input signal 101 is between 0 and 0.5 V, the input voltage level of the output signal 102 will be approximately 0 V. When the input voltage level is at any value above 0.5 V, the voltage level of output signal 102 will be approximately 0.5 V. The swing of the output voltage range can be limited by voltage-level translator 10. Voltage-level translator 10 can then be used as an input buffer to one or more circuit components that might be connected to output node 14, to protect the one or more circuit components from high voltages.

Additionally, voltage level translator 10 can comprise a low-power device by using JFETs. JFETs can operate at a lower voltage than certain other semiconductor devices. JFETs can also switch faster than certain other semiconductor devices at a given operating voltage level.

If the gate-source voltage differential applied to second output transistor 18 is raised too high the gate-source voltage differential may exceed the cut-in voltage of the pn-junction formed between the gate and source terminals or between the source and gate terminals (depending on the polarity of the device) of second output transistor 18. The relevant pn-junction will, as a result, become forward-biased. A forward-biased gate junction may allow a substantial amount of current to flow between the gate and the source in one direction or the other, potentially damaging the relevant output transistor and/or other components of output buffer circuit 10. Coupling the gate of second output transistor 18 to amplifier output node 48 (instead of the traditional method of using amplifier output node 56) prevents forward biasing of the pn-junction of second output transistor 18 because the voltage swing of amplifier output node 48 is limited between 0 and the threshold voltage of second amplifier transistor 24b.

Consequently, in particular embodiments, voltage level translator 10 allows second output transistor 18 to be safely turned on without forward biasing a pn-junction of second output transistor 18. In particular embodiments, voltage level translator 10 may additionally or alternatively be able to meet desired timing requirements using smaller transistors, thereby reducing the size of voltage level translator 10. Thus, particular embodiments of voltage level translator 10 may provide multiple operational benefits. Specific embodiments, however, may provide all, some, or none of these benefits.

Figure 2A:
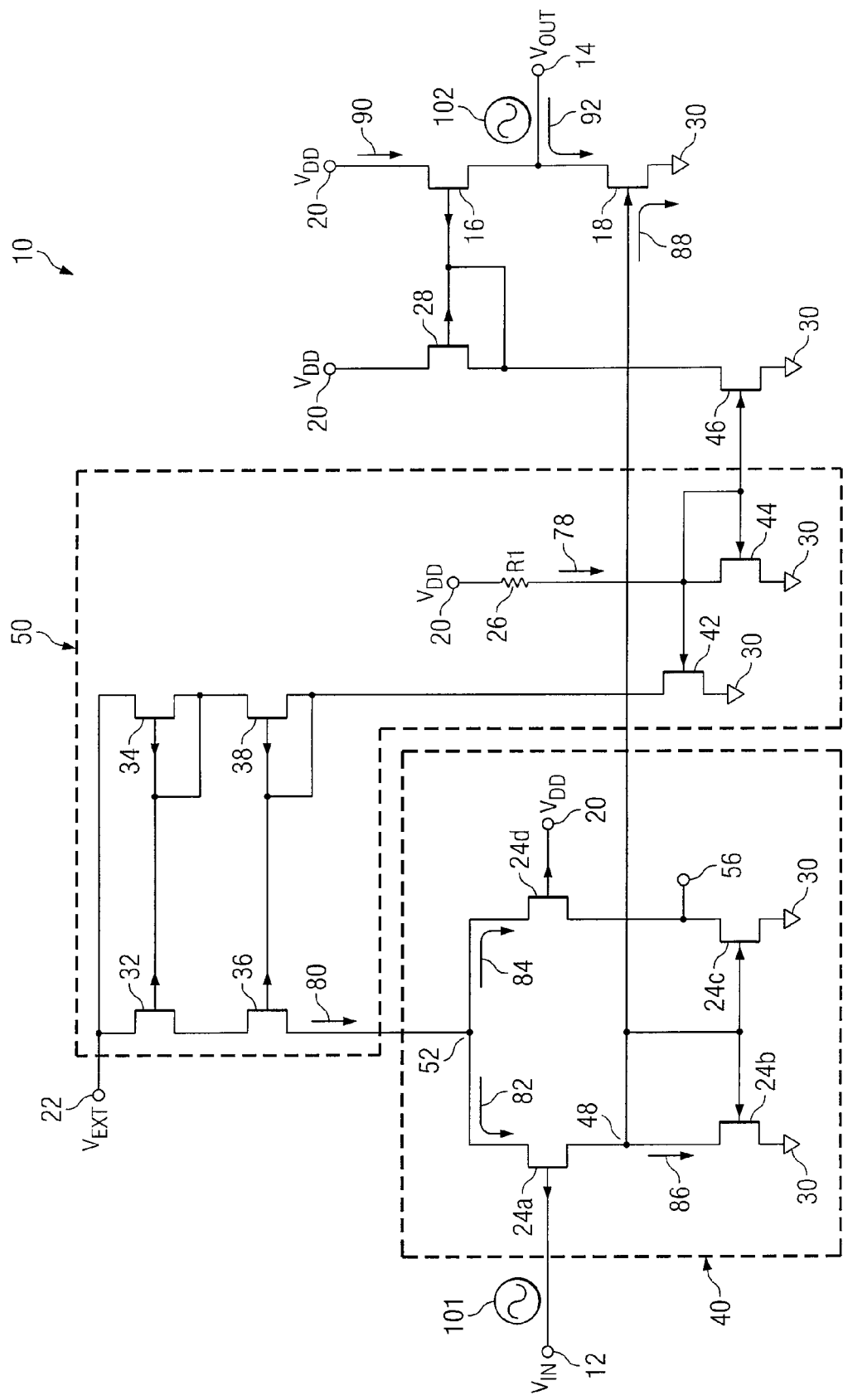
FIGS. 2A and 2B illustrate example operation of the voltage-level translator shown in FIG. 1.
Figure 2B:
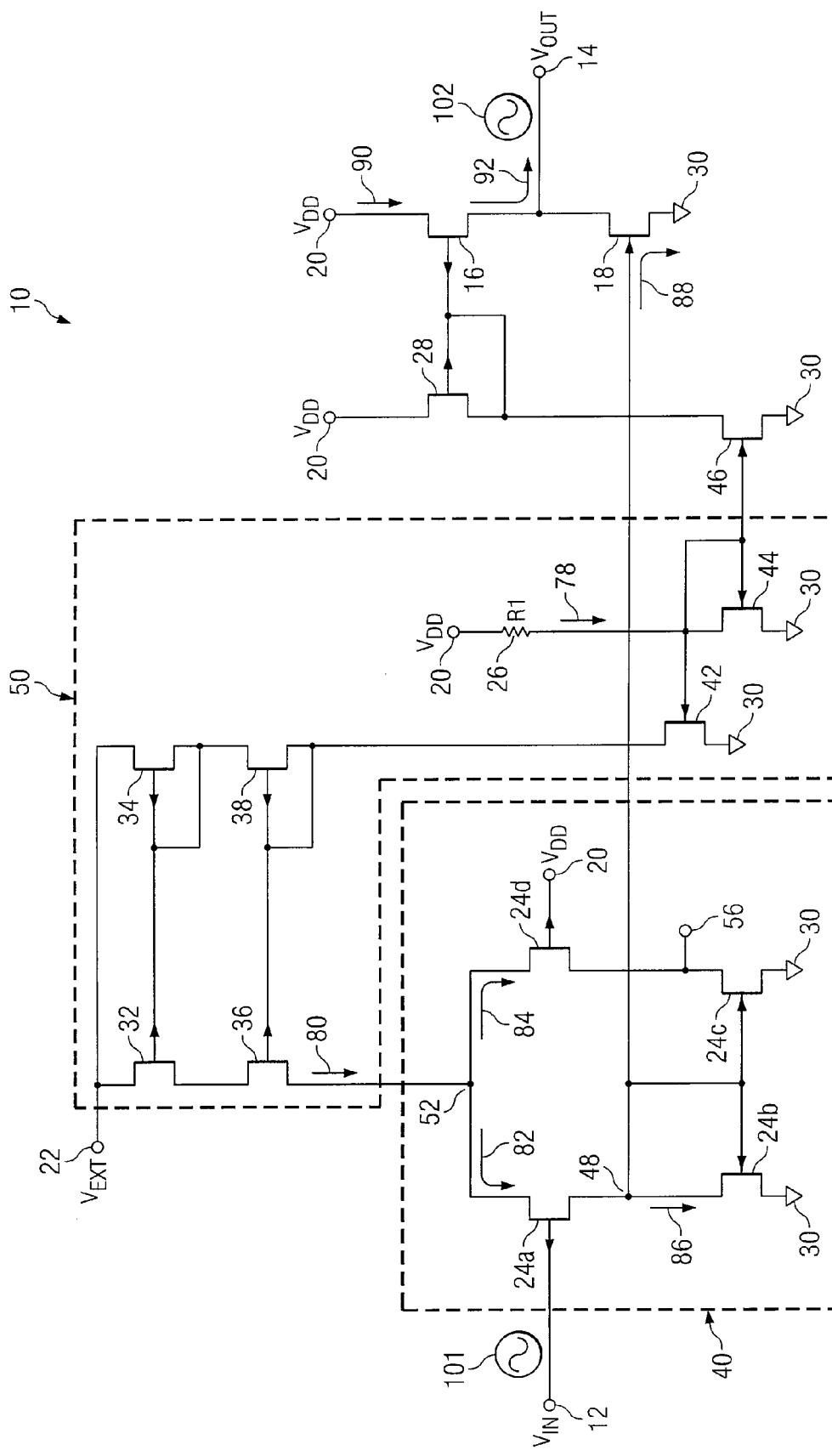

FIGS. 2A and 2B illustrate example operation of a particular embodiment of voltage-level translator 10 with various input voltage levels. In FIGS. 1, 2A, and 2B, like numbers denote like components. FIGS. 2A and 2B are similar to FIG. 1, except in FIGS. 2A and 2B various currents are introduced to demonstrate the operation of voltage-level translator 10 in response to different input signals 101. In the examples illustrated by FIGS. 2A and 2B, $V_{ExT}$ is assumed to be 2.5 V and $V_{DD}$ is assumed to be 0.5 V. Thus, the input voltage range extends from 0 V to 2.5 V while the output voltage range extends from 0 V to 0.5 V.

FIG. 2A illustrates operation of voltage-level translator 10 in response to an input signal 101 having a voltage level equal to approximately 0 V. Constant current source 50 provides a constant current 80 to node 52 of differential amplifier 40. Constant current 80 splits into differential amplifier currents 82 and 84. Current 82 flows through amplifier transistors 24a and 24b. Current 84 flows through amplifier transistors 24d and 24c. Differential amplifier currents 82 and 84 add up to constant current 80, but may differ in magnitude from one another. Constant current 80 splits at node 52 (node 52 is connected to the respective sources of amplifier transistors 24a and 24d) into currents 82 and 84 whose magnitudes are based, at least in part, on the difference between the voltage levels of input signal 101 and reference voltage 20. For example, if reference voltage 20 is at 0.5 V and input signal 101 is at 0.5 V, the potential difference between node 52 and the gate of amplifier transistor 24a is the same as the potential difference between node 52 and the gate of amplifier transistor 24d. This equal potential difference causes constant current 80 to split into roughly equal currents 82 and 84. If reference voltage 20 and input signal 101 are at different voltage levels constant current 80 will split unequally between currents 82 and 84.

As discussed above, current 78 is generated in constant current source 50 and mirrored in transistors 32 and 36 to produce constant current 80. Constant current 80 flows to node 52 of differential amplifier 40. Constant current 80 splits into differential amplifier currents 82 and 84. The magnitudes of differential amplifier currents 82 and 84 are determined by the potential difference between node 52 and the gates of amplifier transistors 24a and 24d, respectively. When input signal 101 has a voltage level of 0 V, the gate of amplifier transistor 24a is at 0 V, and the gate of amplifier transistor 24d is at 0.5 V. Since the gate of amplifier transistor 24a is at a lower voltage, there is a greater potential difference between it and node 52 than between the gate of amplifier transistor 24d and node 52. Thus, the drain-to-source impedance of amplifier transistor 24d is greater than the drain-to-source impedance of amplifier transistor 24a, and amplifier transistor 24a will conduct more current than amplifier transistor 24d. This means that current 82 will be greater than current 84 in this example. In addition, the voltage level at amplifier output node 48 is small enough so as to not forward bias second output amplifier 18. The voltage swing of amplifier output node 48 is limited between 0 and the threshold voltage of second amplifier transistor 24b.

Amplifier transistors 24b and 24c act together to provide a current 88 through second output transistor 18. When current 86 through transistor 24b goes up, current 88 goes up; and when current 86 goes down, current 88 goes down. Additionally, current 90 through first output transistor 16 is kept relatively constant by the operation of constant current source 50 and transistor 28.

As current 82 increases, currents 86 and 88 also increase. Since current 90 is held relatively constant, an increase in current 88 draws current from output node 14. In this example, the magnitude of current 92 flowing from output node 14 towards second output transistor 18 increases in response to the increase in current 88. Current 92 flowing into voltage-level translator 10 from the output lowers the value of the voltage at output node 14. As a result, in this example, with an input voltage signal at 0 V, the voltage level of output signal 102 will fall to 0 V.

In FIG. 2B, the input voltage level of input signal 101 is greater than 0.5 V. Under these conditions, the illustrated embodiment of voltage-level translator 10 will create an output voltage at node 14 at a high voltage within the output voltage range ($V_{DD}$ in this example). In the example embodiment, $V_{EXT}$ is 2.5 V, and $V_{DD}$ is 0.5 V. With these input conditions, the voltage level at output node 14 of the illustrated embodiment will be approximately 0.5 V.

In FIG. 2B, the voltage level of input signal 101 is at a value above 0.5 V; for example, the voltage level may be 2.5 V. In the illustrated example, reference voltage 20 is assumed to have a voltage level equal to approximately 0.5 V. Current 78 is generated in constant current source 50. The operation of a current mirror in constant current source 50 uses current 78 to produce constant current 80. Constant current 80 flows to node 52 of differential amplifier 40. Constant current 80 splits into differential amplifier currents 82 and 84. The values of differential amplifier currents 82 and 84 are determined by the potential difference between node 52 and the gates of amplifier transistors 24a and 24d, respectively. In this case, the gate of amplifier transistor 24a is at 2.5 V, and the gate of amplifier transistor 24d is at 0.5 V. Since the gate of amplifier transistor 24a is at a higher voltage, there is a smaller potential difference between the gate of amplifier transistor 24a and node 52 than there is between the gate of amplifier transistor 24d and node 52. Thus, the source-to-drain impedance of amplifier transistor 24a is smaller than the source-to-drain impedance of amplifier transistor 24d, and amplifier transistor 24a will conduct less current than amplifier transistor 24d. This means that current 82 will be smaller than current 84 in this example.

As in FIG. 2B, amplifier transistors 24b and 24c act to cause a current 88 to flow through second output transistor 18 that is proportional to current 86. When the voltage level of input signal 101 is at 2.5 V, as it is in the example in FIG. 2B, currents 86 and 88 will both drop. As noted above, current 90 through first output transistor 16 is kept relatively constant by the operation of constant current source 50. Because current 90 is held relatively constant, the decrease in the magnitude of current 88 results in an increase in the magnitude of current 92 flowing out to output node 14. This increase in current 92 flowing out of voltage-level translator 10 raises the value of the voltage at output node 14. However, the voltage level at output node is limited to the voltage $V_{DD}$ at reference voltage 20, which in this case is 0.5 V. Thus, in the illustrated example, with an input voltage signal at 2.5 V, the voltage level of output signal 102 will rise to 0.5 V. Additionally, despite the increased voltage level of input signal 101 and output signal 102, the voltage swing at amplifier output node 48, in the illustrated embodiment, is still small enough to prevent forward-biasing of second output amplifier 18 as the magnitude of the voltage swing occurring at amplifier output node 48 is limited to the threshold voltage of second amplifier transistor 24b. As a result, voltage-level translator 10 can translate a higher voltage swing at the input to a lower voltage swing. Also, the higher voltage swing at the input will not cause any transistors to become forward biased, which could result in excessive, undesirable current.

In this embodiment, any value of the input signal above $V_{DD}$ will produce an output voltage level at output node 14 equal to $V_{DD}$. Thus, the illustrated embodiment of voltage-level translator 10 can be used to translate an input voltage range of, for example, 0 to 2.5 V into an output voltage range of 0 to 0.5 V. As a result, voltage-level translator 10 can be used, for example, as an input buffer between circuits of different logic types.

Figure 3:
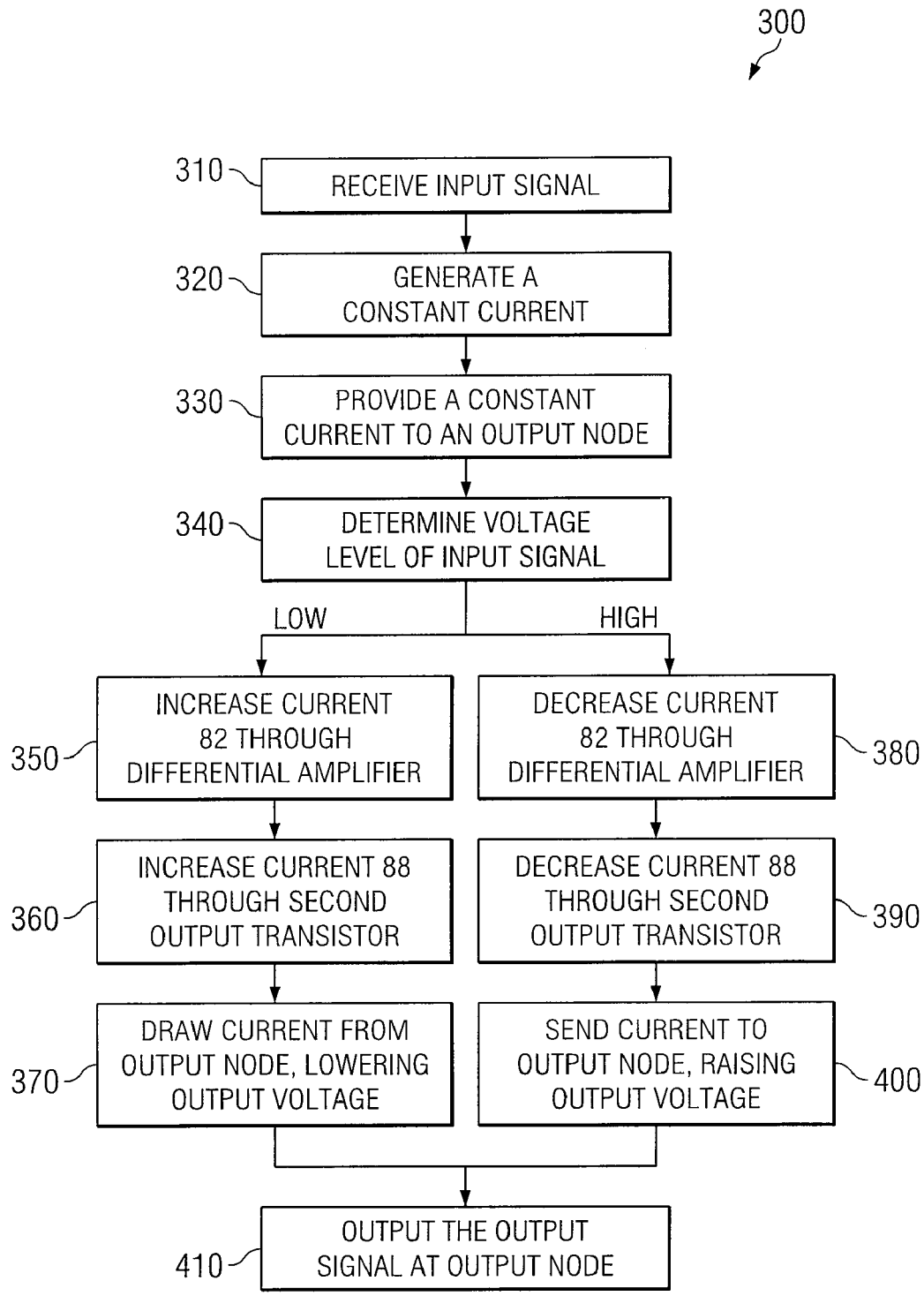
FIG. 3 is a flowchart illustrating in greater detail an example operation of a particular embodiment of the voltage-level translator according to a particular embodiment.

FIG. 3 is a flowchart illustrating an example operation 300 of a particular embodiment of voltage-level translator 10 according to a particular embodiment. The steps illustrated in FIG. 3 may be combined, modified, or deleted where appropriate. Additional steps may also be added to the example operation. Furthermore, the described steps may be performed in any suitable order.

Operation of voltage-level translator 10 in the described example begins with voltage-level translator 10 receiving input signal 101 at step 310. Input signal 101 has a voltage within an input voltage range. For example, in particular embodiments, input signal 101 has a voltage within the range of 0 to 2.5 V.

At step 320, a constant current source generates a constant current. Any constant current source that is operable to generate an appropriate current for use in voltage level translator 10 may be used. At least a portion of the constant current generated will be input into the differential amplifier 40.

At step 330, at least a portion of the constant current is provided to output node 14. In certain embodiments, first output transistor 16 is used in conjunction with a current generator and a current mirror to provide this current to output node 14. In other embodiments, other methods may be used to provide this constant current to output node 14.

At step 340, voltage-level translator 10 detects a voltage level of input signal 101. In particular embodiments, voltage-level translator 10 may detect the voltage level by using differential amplifier 40 to determine if the voltage level of input signal 101 is above or below a reference voltage 20. The method then diverges depending on the voltage level. For example, if input signal 101 is at a voltage level below reference voltage 20, differential amplifier 40 increases the value of current 82 flowing through differential amplifier 40. At step 350, current 82 is increased.

In step 360, the increase in current 82 from step 350 results in an increase in current 88 flowing through second output transistor 18. Because constant current 90 flowing through first output transistor 16 is constant in magnitude, current is drawn from output node 14 in step 370, lowering the output voltage towards 0 V.

If, instead, the voltage level of input signal 101 is detected by differential amplifier 40 to be at a voltage above reference voltage 20, differential amplifier 40 decreases the value of current 82 flowing through differential amplifier 40. At step 380, current 82 is decreased.

In step 390, the decrease in current 82 from step 380 results in a decrease in current 88 flowing through second output transistor 18. Constant current 90 flowing through first output transistor 16 leads to current flowing to output node 14 in step 400, raising the output voltage towards 0.5 V.

In step 410, output signal 102 is now at 0 or 0.5 V, depending on the voltage level of input signal 101. Output signal 102 is output at output node 14, creating an output voltage range that is smaller than the input voltage range, allowing voltage-level translator 10 to be used, for example, as an input buffer for interfacing with an external higher voltage domain.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A voltage-level translator, comprising:
   an input node operable to receive an input signal associated with an input voltage range;
   a differential amplifier operable to:
   produce a first voltage swing at a first amplifier node based at least in part on a difference between the input signal and a voltage supply; and
   produce a second voltage swing at a second amplifier node based at least in part on a difference between the input signal and the voltage supply, whereby the second voltage swing is less than the first voltage swing;
   a first output transistor of a first conductivity type having a drain terminal coupled to an output node and a source terminal coupled to the voltage supply, and operable to provide a substantially constant current to the output node through the drain terminal of the first output transistor;
   a second output transistor of a second conductivity type having a drain terminal coupled to the output node, a source terminal coupled to a ground node, and a gate terminal coupled to the second amplifier node, and wherein the second voltage swing produced by the differential amplifier is less than a cut-in voltage of the second output transistor;
   a current source operable to provide a substantially constant current to the differential amplifier, and further operable to provide a substantially constant current through the first output transistor;
   wherein the voltage-level translator is operable to output a first voltage in an output voltage range at the output node when the input signal is at a high voltage in the input voltage range, and wherein the voltage-level translator is further operable to output a second voltage in the output voltage range at the output node when the input signal is at a low voltage in the input voltage range.

2. The voltage-level translator of claim 1, wherein the output voltage range is smaller than the input voltage range.

3. The voltage-level translator of claim 2, wherein the output voltage range is 0 to 0.5 volts.

4. The differential amplifier of claim 1, wherein the differential amplifier comprises:
   a first transistor of a first conductivity type having a source terminal coupled to the current source, a gate terminal coupled to the input node, and a drain terminal coupled to a drain terminal of a second transistor of a second conductivity type;
   the second transistor having a source terminal coupled to ground, a gate terminal coupled to a gate terminal of a third transistor of a second conductivity type and to the drain terminal of the first transistor, and a drain terminal coupled to the drain terminal of the first transistor;
   the third transistor having a gate terminal coupled to the gate terminal of the second transistor, a source terminal coupled to ground, and a drain terminal coupled to a drain terminal of a fourth transistor of a first conductivity type; and
   the fourth transistor having a drain terminal coupled to a drain terminal of the third transistor, a source terminal coupled to the current source, and a gate terminal coupled to a reference voltage supply.

5. The voltage-level translator of claim 1, wherein the current source comprises a current mirror.

6. The voltage-level translator of claim 1, wherein at least one of the first output transistor and the second output transistor comprises a junction field effect transistor (JFET).

7. The voltage-level translator of claim 6, wherein the first output transistor comprises a p-type JFET and the second output transistor comprises an n-type JFET.

* * * * *